United States Patent
Choi et al.

(10) Patent No.: US 11,990,458 B2
(45) Date of Patent: May 21, 2024

(54) LIGHT EMITTING DIODE DISPLAY DEVICE

(71) Applicant: LG Display Co., Ltd., Seoul (KR)

(72) Inventors: Jae Yong Choi, Paju-si (KR); Seung Jun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 144 days.

(21) Appl. No.: 17/421,684

(22) PCT Filed: Sep. 2, 2020

(86) PCT No.: PCT/KR2020/011761
§ 371 (c)(1),
(2) Date: Jul. 8, 2021

(87) PCT Pub. No.: WO2021/132842
PCT Pub. Date: Jul. 1, 2021

(65) Prior Publication Data
US 2022/0320055 A1    Oct. 6, 2022

(30) Foreign Application Priority Data

Dec. 27, 2019   (KR) .......................... 10-2019-0176217

(51) Int. Cl.
*H01L 25/16*   (2023.01)
*H01L 23/00*   (2006.01)
(Continued)

(52) U.S. Cl.
CPC ............ *H01L 25/167* (2013.01); *H01L 24/24* (2013.01); *H01L 24/25* (2013.01); *H01L 24/73* (2013.01);
(Continued)

(58) Field of Classification Search
CPC ....... H01L 25/167; H01L 24/24; H01L 24/25; H01L 24/73; H01L 33/62; H01L 24/14;
(Continued)

(56) References Cited

U.S. PATENT DOCUMENTS

2006/0240578 A1   10/2006   Oohata et al.
2006/0250085 A1   11/2006   Doi et al.
(Continued)

FOREIGN PATENT DOCUMENTS

JP    2013-235148 A    11/2013
KR   10-2016-0028436 A   3/2016

OTHER PUBLICATIONS

International Search Reported dated Dec. 10, 2020 for PCT Application No. PCT/KR2020/011761, 10 pgs.

*Primary Examiner* — David Vu
(74) *Attorney, Agent, or Firm* — Seed IP Law Group LLP

(57) ABSTRACT

The present disclosure relates to an LED display device, and more particularly, to an LED display device including a repair structure for a deteriorated pixel. In the present disclosure, a sub LED electrically coupled to first and second connecting electrodes for applying a voltage to a LED is disposed on a deteriorated LED. Thus, deterioration of a display quality due to a deteriorated pixel is prevented. Since it is not required to remove a deteriorated LED, a fabrication cost is reduced and a process efficiency is improved.

10 Claims, 7 Drawing Sheets

(51) Int. Cl.
  *H01L 27/12* (2006.01)
  *H01L 33/62* (2010.01)
(52) U.S. Cl.
  CPC .............. *H01L 33/62* (2013.01); *H01L 24/14* (2013.01); *H01L 24/16* (2013.01); *H01L 2224/1403* (2013.01); *H01L 2224/16145* (2013.01); *H01L 2224/24051* (2013.01); *H01L 2224/24147* (2013.01); *H01L 2224/244* (2013.01); *H01L 2224/245* (2013.01); *H01L 2224/25174* (2013.01); *H01L 2224/73209* (2013.01); *H01L 2224/73259* (2013.01); *H01L 2924/0542* (2013.01); *H01L 2924/0544* (2013.01); *H01L 2924/0549* (2013.01); *H01L 2924/12041* (2013.01); *H01L 2933/0066* (2013.01)
(58) Field of Classification Search
  CPC ............. H01L 24/16; H01L 2224/1403; H01L 2224/16145; H01L 2224/24051; H01L 2224/24147; H01L 2224/244; H01L 2224/245; H01L 2224/25174; H01L 2224/73209; H01L 2224/73259; H01L 2924/0542; H01L 2924/0544; H01L 2924/0549; H01L 2924/12041; H01L 2933/0066; H01L 25/0753; H01L 33/46; H01L 24/17; H01L 24/32; H01L 24/92; H01L 27/124; H01L 2224/04105; H01L 2224/16227; H01L 2224/1703; H01L 2224/24145; H01L 2224/24225; H01L 2224/92244; H01L 25/0756; H01L 2224/32225; H01L 2224/73267; H01L 33/0095; H01L 27/156; H01L 27/1214; H01L 33/60; H01L 21/768
  See application file for complete search history.

(56) References Cited

U.S. PATENT DOCUMENTS

| | | |
|---|---|---|
| 2013/0015473 A1 | 1/2013 | Chen et al. |
| 2014/0167611 A1 | 6/2014 | Tischler et al. |
| 2017/0179092 A1* | 6/2017 | Sasaki .................. H10K 59/70 |
| 2018/0130751 A1 | 5/2018 | Bower |
| 2019/0172761 A1 | 6/2019 | Guo et al. |

* cited by examiner

LIGHT EMITTING DIODE DISPLAY DEVICE

BACKGROUND

Technical Field

The present application claims the priority benefit of Republic of Korea Patent Application No. 10-2019-0176217 filed in Republic Korea on Dec. 27, 2019, which is hereby incorporated by reference in its entirety.

The present disclosure relates to a light emitting diode display device, and more particularly, to a light emitting diode display device including a repair structure for a deteriorated pixel.

Discussion of the Related Art

Recently, requests for flat panel display devices having a small occupied area have been increased according to enlargement of display devices, and a technology of the flat panel display devices such as a liquid crystal display (LCD) device or an organic electroluminescent display (OLED) device including an organic light emitting diode (OLED) has been rapidly developed.

Here, in the LCD device, a backlight unit is disposed under a liquid crystal panel having polarizing plates on front and rear surfaces thereof. Therefore, only less than 5% of a light from a light source of the backlight unit passes through the liquid crystal panel, and the LCD device has a disadvantage in a light efficiency.

Although the OLED device has an improved light efficiency as compared with the LCD device, the OLED device still has a limit in a light efficiency and has a disadvantage in a durability and/or a lifetime of the display device.

Thus, to solve the above problems of the LCD device and/or the OLED device, a light emitting diode (LED) display device using a light emitting diode (LED) as a light emitting element has been recently suggested. A small size LED such as a mini-LED or an ultra-small size LED such as a micro-LED may be used for the LED display device.

The micro-LED display device displays an image by disposing an ultra-small size LED (μLED) having a size smaller than 100 μm in each subpixel and has advantages such as a low power consumption and a small size.

The LED display device is formed by transferring a LED on a wafer onto a selective location of a substrate having a transistor. In the LED display device, deterioration control of the LED on the wafer and secure yield of the transferring process are a key technology.

Accordingly, to prevent deterioration of the LED display device due to deterioration of the LED and deterioration of the transferring process, after the LED is transferred to the substrate, a process of discriminating whether deterioration happens or not is performed. When deterioration happens, a process of replacing the deteriorated LED with a normal LED occurs.

The process of replacing the deteriorated LED requires a process of removing the LED attached to the substrate by an adhesive. Since the process of removing the deteriorated LED should be performed without an influence on adjacent normal LEDs, a lot of time and a precise process are required. Therefore, a problem that a process efficiency decreases is caused.

Recently, although the process of removing the deteriorated LED may be omitted by further forming a redundancy ED, a cost increases due to the redundancy LED and a process of forming an additional conductive line for the redundancy LED is required.

Thus, the LED display device has a disadvantage such as a low process efficiency.

BRIEF SUMMARY

Accordingly, the present disclosure is directed to a light emitting diode display device that substantially obviates one or more of the problems due to the limitations and disadvantages of the related art. One or more embodiments of the present disclosure prevents deterioration of a display quality due to a deteriorated pixel without a process of removing a deteriorated light emitting diode.

One or more embodiments of the present disclosure improves a process efficiency through reduction of a fabrication cost and simplification of a process.

Additional features and technical benefits of the disclosure will be set forth in the description which follows, and in part will be apparent from the description, or may be learned by practice of the disclosure. Further technical benefits of the disclosure will be realized and attained by the structure particularly pointed out in the written description and claims hereof as well as the appended drawings.

The present disclosure provides an LED display device including: first and second thin film transistors on a substrate; a first LED electrically connected to the first thin film transistor; a second LED electrically connected to the second thin film transistor; a sub LED on the first LED, the sub LED electrically connected to the first thin film transistor and including a reflecting layer reflecting a light toward a direction opposite to the first LED, wherein when a signal is applied to the first and second thin film transistors, the second LED and the sub LED emit a light.

The first LED includes a first n-type electrode electrically connected to a drain electrode of the thin film transistor through a first connecting electrode, and a first p-type electrode electrically connected to a common line through a second connecting electrode, the sub LED includes a second n-type electrode electrically connected to the first connecting electrode, and a second p-type electrode electrically connected to the second connecting electrode, the LED display device further includes first-first and first-second semiconductor layers and a first active layer between the first n-type electrode and the first p-type electrode, and second-first and second-second semiconductor layers and a second active layer between the second n-type electrode and the second p-type electrode.

The reflecting layer is disposed between the second-second semiconductor layer and the second p-type electrode, and the reflecting layer is disposed between the second-first semiconductor layer and the second n-type electrode.

The second p-type electrode is electrically connected to the second connecting electrode through a third connecting electrode, and the second p-type electrode is electrically connected to an auxiliary electrode extending from the second connecting electrode.

The first n-type electrode and the first p-type electrode of the first LED are disposed along a first direction, the second n-type electrode and the second p-type electrode of the sub LED are disposed along the first direction, the first n-type electrode and the first p-type electrode of the first LED are disposed along a first direction, the second n-type electrode and the second p-type electrode of the sub LED are disposed along a second direction different from the first direction, the LED display device further includes a first bump between the first connecting electrode and the second n-type electrode, and a second bump between the second connecting electrode and the second p-type electrode.

In an LED display device according to the present disclosure, since a sub LED electrically connected to first and second connecting electrodes for applying a voltage to a LED is disposed over a deteriorated LED, deterioration of a display quality due to a deteriorated pixel is prevented without removing the deteriorated LED. Therefore, a fabrication cost is reduced and a process efficiency is improved.

In addition, since an additional redundancy LED is not required, a fabrication cost is reduced and a process efficiency is improved due to omission of an additional redundancy LED.

Further, since a location for an additional redundancy LED is not considered, a sufficient emitting area for a LED is obtained and an emission efficiency of a LED is also improved. Thus, an image of a high luminance is obtained.

Moreover, since a number of subpixels per a unit area increases, a LED display device having a high resolution is obtained.

DETAILED DESCRIPTION

Figure 1:
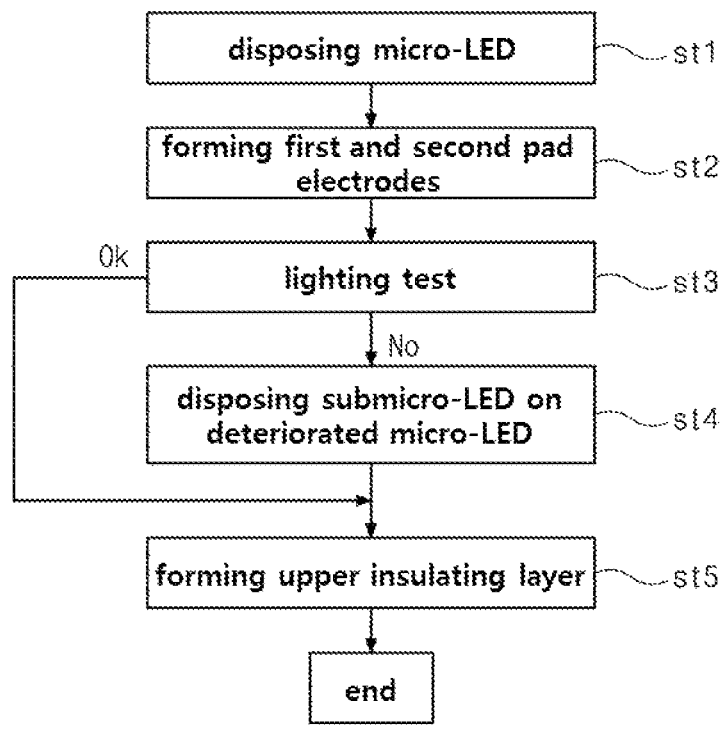
FIG. 1 is a schematic flow chart showing a transfer and a lighting test for a light emitting diode among a method of fabricating a light emitting diode display device according to an embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary. In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used. What a device or a layer is designated by "on" another device or another layer includes a case where another layer or another device is interposed directly on or in a middle of another device. When an element is described as "connected to," "combined with" or "contact" another element, it would be understood that an element may be directly connected to or combined with another element, that another element may be "interposed" between elements, or that elements may "be connected to," "be combined with" or "contact" each other through another element.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

A size and a thickness of each element in drawings are shown for convenience of illustration, and the present disclosure is not limited to the size and the thickness of the illustrated element. Hereinafter, various embodiments of the present disclosure will be described in detail with reference to the accompanying drawings.

FIG. 1 is a schematic flow chart showing a transfer and a lighting test for a light emitting diode among a method of fabricating a light emitting diode display device according to an embodiment of the present disclosure.

As shown, in a first step st1 of a light emitting diode (LED) display device according to an embodiment of the present disclosure, a subpixel circuit including a transistor is formed on a substrate, and a light emitting diode (LED) emitting a light toward a front of the substrate is disposed on each subpixel.

Here, the LED has a state of epitaxial growth on a wafer including at least one of sapphire, silicon carbide (SiC), silicon (Si), gallium arsenide (GaAs), gallium nitride (GaN), zinc oxide (ZnO), silicon (Si), gallium phosphide (GaP), indium phosphide (InP), germanium (Ge) and gallium oxide (Ga2O3) and is transferred onto each subpixel of the substrate.

In a second step st2, first and second pad electrodes are formed on the LED.

Here, the first pad electrode contacts a first-first semiconductor layer of the LED to supply a data signal to the LED, and the second pad electrode contacts a second semiconductor layer of the LED to supply a common signal to the LED.

After the first and second pad electrodes are formed, a lighting test for the LED is performed in a third step st3.

In the lighting test, it is inspected whether the LED is deteriorated or not through various methods. For example, it may be judged in the lighting test whether the LED is deteriorated or not by verifying conduction of the LED through a probe.

Alternatively, it may be judged in the lighting test whether the LED is deteriorated or not by verifying lighting of the LED through applying a driving signal to the first and second pad electrodes of the LED.

Here, when it is judged whether the LED is deteriorated or not using a probe, the second step of forming the first and second pad electrodes may be omitted.

A visual inspection method may be adopted or a method of detecting an area where an electric shortage occurs by flowing a current may be adopted as the lighting test according to whether the LED is deteriorated or not. However, the lighting test is not limited thereto, and any method where the deteriorated LED is detected may be adopted.

When deterioration of the LED is detected through the lighting test, a phenomenon that a subpixel where the deteriorated LED is located is displayed as a black spot may occur.

The LED judged as a positive one "Ok" in the lighting test is transmitted to a fifth step st5. In the fifth step st5, an insulating layer or a light converting layer for protecting the first and second pad electrodes and the LED is formed on the LED.

The transfer of the LED and the lighting test are completed through the fifth step st5.

The LED judged as a deteriorated one "No" in the lighting test of the third step st3 is transmitted to a repairing process of a fourth step st4. In the LED display device according to an embodiment of the present disclosure, the repairing process is performed by disposing a sub LED on the LED judged as a deteriorated one.

In the repairing process, an additional process of removing the LED judged as a deteriorated one (hereinafter, a deteriorated LED) is omitted, and the first and second pad electrodes of the deteriorated LED and the sub LED are electrically connected to each other.

Therefore, in the LED display device according to an embodiment of the present disclosure, deterioration of a display quality due to a deteriorated pixel is prevented. In addition, since the deteriorated LED is not required to be removed, a fabrication cost is reduced and a process efficiency is improved.

In addition, since an additional redundancy LED is not required, a fabrication cost is further reduced and a process efficiency is further improved.

The LED through the completed repairing process is transmitted to the fifth step st5, the transfer of the LED and the lighting test are completed by forming an insulating layer or a light converting layer for protecting the first and second pad electrodes and the LED on the LED.

First Embodiment

Figure 2:
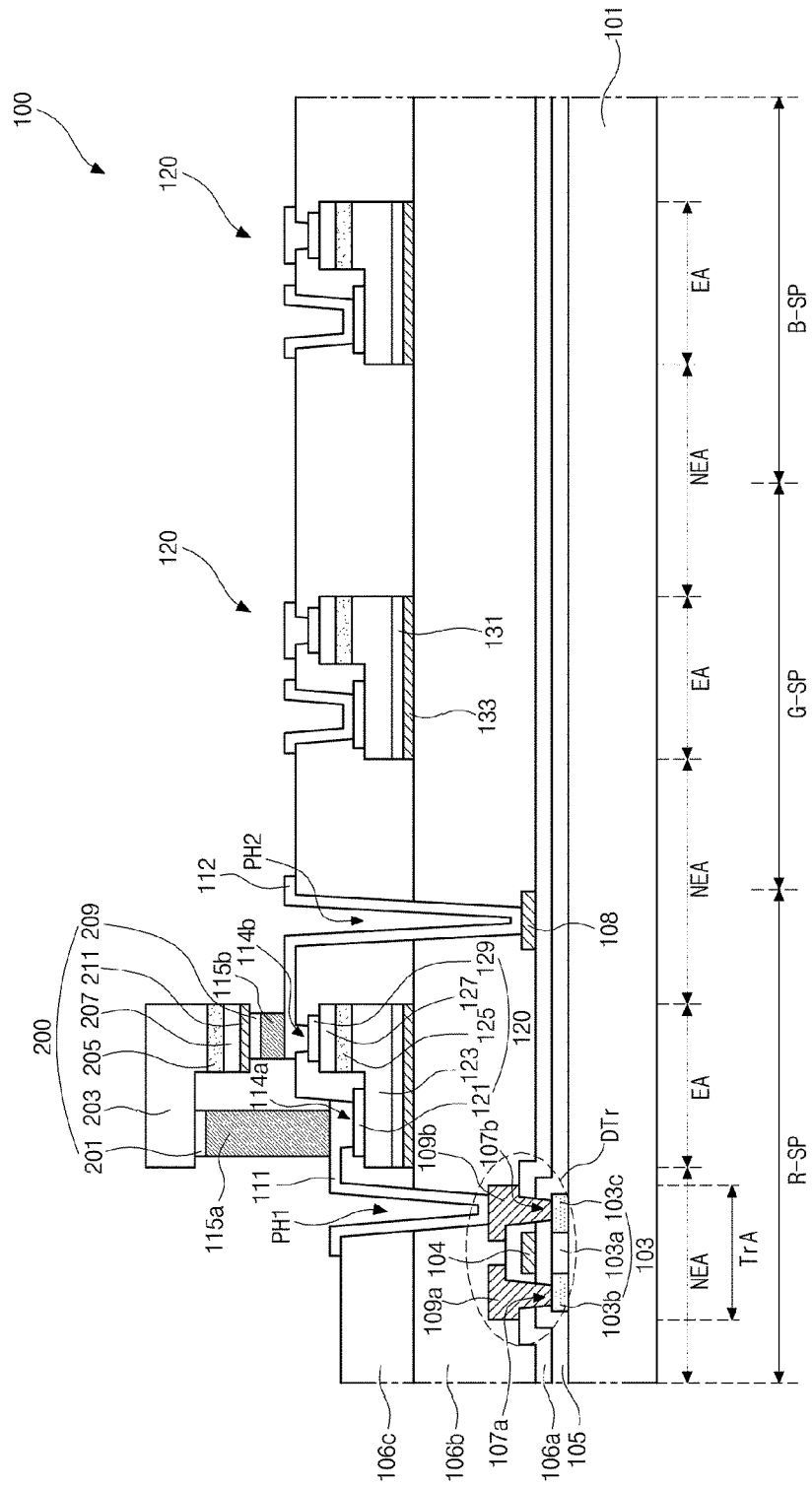
FIG. 2 is a schematic cross-sectional view showing three subpixels of a light emitting diode display device according to a first embodiment of the present disclosure.

FIG. 2 is a schematic cross-sectional view showing three subpixels of a light emitting diode display device according to a first embodiment of the present disclosure.

Prior to illustration, although a driving thin film transistor DTr and a switching thin film transistor are disposed in each subpixel R-SP, G-SP and B-SP defined on a substrate 101, the driving thin film transistor DTr is shown in one subpixel R-SP, G-SP and B-SP for convenience of illustration and conciseness of drawing.

Although each of the plurality of subpixels R-SP, G-SP and B-SP may be defined by a crossing structure of data lines and gate lines, it is not limited thereto.

As shown, each of subpixels R-SP, G-SP and B-SP includes an emitting area EA corresponding to a light emitting diode 120 and a non-emitting area NEA along a boundary of the emitting area EA.

A switching area TrA where a driving thin film transistor DTr is formed is disposed at one side of the non-emitting area NEA. A semiconductor layer 103 is disposed in the switching area TrA. The semiconductor layer 103 includes silicon and has an active region 103a at a center thereof and source and drain regions 103b and 103c at both sides of the active region 103a. The active region 103a constitutes a channel and the source and drain regions 103b and 103c are doped with impurities of a high concentration.

A gate insulating layer 105 is disposed on the semiconductor layer 103.

A gate electrode 104 is disposed on the gate insulating layer 105 corresponding to the active region 103a of the semiconductor layer 103.

A first interlayer insulating layer 106a is disposed on the gate electrode 104. The first interlayer insulating layer 106a and the gate insulating layer 105 have first and second semiconductor contact holes 107a and 107b exposing the source and drain regions 103b and 103c, respectively.

Source and drain electrodes 109a and 109b spaced apart from each other are disposed on the first interlayer insulating layer 106a having the first and second semiconductor contact holes 107a and 107b. The source and drain electrodes 109a and 109b contact the source and drain regions 103b and 103c through the first and second semiconductor contact holes 107a and 197b, respectively.

The source electrode 109a is connected to a data line, and a common line 108 parallel to the data line is disposed on the first interlayer insulating layer 106a.

Selectively, the common line 108 may be disposed in each of a plurality of unit pixels. In this case, at least three subpixels R-SP, G-SP and B-SP constituting each unit pixel share one common line 108. Thus, a number of the common lines 108 for driving each subpixel R-SP, G-SP and B-SP may be reduced. An aperture ratio of each unit pixel increases or a size of each unit pixel decreases according to the reduced number of the common lines 108.

A second interlayer insulating layer 106b is disposed on the source and drain electrodes 109a and 109b, the common line 108 and the first interlayer insulating layer 106a exposed through the source and drain electrodes 109a and 109b.

The source and drain electrodes 109a and 109b, the semiconductor layer 103 including the source and drain regions 103b and 103c contacting the source and drain electrodes 109a and 109b, the gate insulating layer 105 on the semiconductor layer 103 and the gate electrode 104 constitute the driving thin film transistor DTr.

The switching thin film transistor has the same structure as the driving thin film transistor DTr and may be electrically connected to the driving thin film transistor DTr.

Although the switching thin film transistor and the driving thin film transistor DTr have a top gate type where the semiconductor layer 103 includes a polycrystalline silicon semiconductor layer or an oxide semiconductor layer in the drawing, the switching thin film transistor and the driving thin film transistor DTr may have a bottom gate type where the semiconductor layer 103 includes intrinsic amorphous silicon and impurity-doped amorphous silicon in another embodiment.

A light emitting diode (LED) 120 is disposed in each subpixel R-SP, G-SP and B-SP on the second interlayer insulating layer 106b. Each LED 120 includes a first n-type electrode 121, an emitting layer and a first p-type electrode 129.

The emitting layer emits a light due to recombination of an electron and a hole according to a current flowing between the first n-type electrode 121 and the first p-type electrode 129. The emitting layer includes a first-first semiconductor layer 123, a first active layer 125 and a first-second semiconductor layer 127.

The first-first semiconductor layer 123 supplies an electron to the first active layer 125. The first-first semiconductor layer 123 may include a semiconductor material of an n-type gallium nitride (n-GaN) group, and an n-type gallium nitride group may include gallium nitride (GaN), aluminum gallium nitride (AlGaN), indium gallium nitride (InGaN) or aluminum indium gallium nitride (AlInGaN), etc.

The impurity used for doping the first-first semiconductor layer 123 may include silicon (Si), germanium (Ge), selenium (Se), tellurium (Te) or carbon (C), etc.

The first active layer 125 is disposed on one side of the first-first semiconductor layer 123. The first active layer 125 has a multi quantum well (MQW) structure including a well layer and a barrier layer having a band gap greater than the well layer.

The first active layer 125 may have a multi quantum well structure of indium gallium nitride/gallium nitride (InGaN/GaN), etc.

The first-second semiconductor layer 127 is disposed on the first active layer 125 and supplies a hole to the first active layer 125. The first-second semiconductor layer 127 may include a semiconductor material of a p-type gallium nitride (p-GaN), and a p-type gallium nitride may include gallium nitride (GaN), aluminum gallium nitride (AlGaN), indium gallium nitride (InGaN) or aluminum indium gallium nitride (AlInGaN), etc. The impurity used for doping the first-second semiconductor layer 127 may include magnesium (Mg), zinc (Zn) or beryllium (Be), etc.

The first p-type electrode 129 is disposed on the first-second semiconductor layer 127 and may be used as a cathode supplying a hole to the first-second semiconductor layer 127. The first n-type electrode 121 is disposed on the other side of the first-first semiconductor layer 123 to be electrically separated from the first active layer 125 and the first-second semiconductor layer 127 and may be used as an anode supplying an electron to the first-first semiconductor layer 123.

Each of the first n-type electrode 121 and the first p-type electrode 129 may include a transparent conductive material or a reflective conductive material according to a light emission direction of the LED 120. For example, although the transparent conductive material may be indium tin oxide (ITO) or indium zinc oxide (IZO), etc., it is not limited thereto. Although the reflective conductive material may be a material including at least one of a metallic material such as gold (Au), tungsten (W), platinum (Pt), silicon (Si), iridium (Ir), silver (Ag), copper (Cu), nickel (Ni), titanium (Ti) or chromium (Cr), etc., and an alloy thereof, it is not limited thereto.

Thus, each of the first n-type electrode 121 and the first p-type electrode 129 may include a reflective conductive material in a bottom emission type where a light of the LED 120 is emitted toward a direction of the substrate 101, and each of the first n-type electrode 121 and the first p-type electrode 129 may include a transparent conductive material in a top emission type where a light of the LED 120 is emitted toward an opposite direction of the substrate 101.

Hereinafter, the top emission type where each of the first n-type electrode 121 and the first p-type electrode 129 includes a transparent conductive material will be illustrated as an example.

The LED 120 emits a light due to recombination of an electron and a hole according to a current flowing between the first n-type electrode 121 and the first p-type electrode 129.

A reflecting pattern 133 may be further disposed between the first-first semiconductor layer 123 and the second interlayer insulating layer 106b of the LED 120, and an insulating pattern 131 may be disposed the reflecting pattern 133 and the first-first semiconductor layer 123.

The reflecting pattern 133 upwardly reflects a light emitted toward a direction of the substrate 101 among a light of the LED 120 to improve a light efficiency of the LED 120.

Although the reflecting pattern 133 may be disposed on the substrate 101 and may include the same material and the same layer as the gate electrode 104 of the driving thin film transistor DTr, it is not limited thereto. For example, the reflecting pattern 133 on the substrate 101 may include the same material as one of electrodes of the driving thin film transistor DTr.

A third interlayer insulating layer 106c is disposed on the LED 120 in each subpixel R-SP, G-SP and B-SP. The third interlayer insulating layer 106c and the second interlayer insulating layer 106b have a drain contact hole PH1 exposing the drain electrode 109b of the driving thin film transistor DTr and a common contact hole PH2 exposing the common line 108.

In addition, the third interlayer insulating layer 106c has first and second electrode contact holes 114a and 114b exposing the first n-type electrode 121 and the first p-type electrode 129, respectively, of the LED 120 in each subpixel R-SP, G-SP and B-SP.

A first connecting electrode 111 electrically connecting the drain electrode 109b of the driving thin film transistor DTr exposed through the drain contact hole PH1 and the first n-type electrode 121 of the LED 120 exposed through the first electrode contact hole 114a and a second connecting electrode 112 electrically connecting the common line 108 exposed through the common contact hole PH2 and the first p-type electrode 129 exposed through the second electrode contact hole 114b are disposed on the third interlayer insulating layer 106c.

Although each of the first and second connecting electrodes 111 and 112 may include a transparent conductive oxide material such as indium tin oxide (ITO), indium zinc oxide (IZO), indium tin zinc oxide (ITZO), zinc oxide (ZO) and tin oxide (TO) for transmitting a light emitted from the active layer 125 of the LED 120, it is not limited thereto.

Thus, the first n-type electrode 121 of the LED 120 is electrically connected to the drain electrode 109b of the driving thin film transistor DTr through the first connecting electrode 111, and the first p-type electrode 129 is electrically connected to the common line 108 through the second connecting line 112 so that the LED 120 in each subpixel R-SP, G-SP and B-SP can emit a light.

A unit pixel may be defined by combination of subpixels R-SP, G-SP and B-SP, and each subpixel R-SP, G-SP and B-SP may emit a light having various colors.

For example, the subpixels R-SP, G-SP and B-SP may include a red subpixel, a green subpixel and a blue subpixel. A red colored light may be emitted from the emitting area EA of the red subpixel R-SP, a green colored light may be emitted from the emitting area EA of the green subpixel G-SP, and a blue colored light may be emitted from the emitting area EA of the blue subpixel B-SP. However, it is not limited thereto.

The LEDs 120 corresponding to the emitting area EA of the subpixels R-SP, G-SP and B-SP may emit a light of different colors or same colors. For example, when the LEDs 120 of the subpixels R-SP, G-SP and B-SP emit a light of different colors, the LED 120 in the red subpixel R-SP emits a red colored light, the LED 120 in the green subpixel G-SP emits a green colored light, and the LED 120 in the blue subpixel B-SP emits a blue colored light.

When the LEDs 120 of the subpixels R-SP, G-SP and B-SP emit a light of same colors, the light of the LEDs 120 may be converted into a light of different colors by an optical converter such as a light converting layer on the LEDs 120 of the subpixels R-SP, G-SP and B-SP.

Here, the optical converter may be disposed to correspond to each subpixel R-SP, G-SP and B-SP. Photo acryl, silicon oxide (SiOx) or silicon nitride (SiNx) including a light converting material such as a nano fluorescent material, an organic fluorescent material or a quantum dot, etc., may be disposed on the LED 120 in each subpixel R-SP, G-SP and B-SP through an inkjet printing method or a dotting method to form a plurality of optical converters.

When the LED 120 corresponding to the red subpixel R-SP among the LEDs 120 of the subpixels R-SP, G-SP and B-SP is deteriorated, a sub LED 200 is disposed over the deteriorated LED 120.

The sub LED 200 includes a second n-type electrode 201, an emitting layer and a second p-type electrode 209. The emitting layer emits a light due to recombination of an electron and a hole according to a current flowing between the second n-type electrode 201 and the second p-type electrode 209.

The emitting layer includes a second-first semiconductor layer 203, a second active layer 205 and a second-second semiconductor layer 207.

The second-first semiconductor layer 203 supplies an electron to the second active layer 205. The second-first semiconductor layer 203 may include a semiconductor material of an n-type gallium nitride (n-GaN) group, and an n-type gallium nitride group may include gallium nitride (GaN), aluminum gallium nitride (AlGaN), indium gallium nitride (InGaN) or aluminum indium gallium nitride (AlInGaN), etc.

The impurity used for doping the second-first semiconductor layer 203 may include silicon (Si), germanium (Ge), selenium (Se), tellurium (Te) or carbon (C), etc.

The second active layer 205 is disposed on one side of the second-first semiconductor layer 203. The second active layer 205 has a multi quantum well (MQW) structure including a well layer and a barrier layer having a band gap greater than the well layer.

The second active layer 205 may have a multi quantum well structure of indium gallium nitride/gallium nitride (InGaN/GaN), etc.

The second-second semiconductor layer 207 is disposed on the second active layer 205 and supplies a hole to the second active layer 205. The second-second semiconductor layer 207 may include a semiconductor material of a p-type gallium nitride (p-GaN), and a p-type gallium nitride may include gallium nitride (GaN), aluminum gallium nitride (AlGaN), indium gallium nitride (InGaN) or aluminum indium gallium nitride (AlInGaN), etc. The impurity used for doping the second-second semiconductor layer 207 may include magnesium (Mg), zinc (Zn) or beryllium (Be), etc.

The second p-type electrode 209 is disposed on the second-second semiconductor layer 207 and may be used as a cathode supplying a hole to the second-second semiconductor layer 207. The second n-type electrode 201 is disposed on the other side of the second-first semiconductor layer 203 to be electrically separated from the second active layer 205 and the second-second semiconductor layer 207 and may be used as an anode supplying an electron to the second-first semiconductor layer 203.

The sub LED 200 is disposed over the LED 120 so that the second n-type electrode 201 can be electrically connected to the first connecting electrode 111 and the second p-type electrode 209 can be electrically connected to the second connecting electrode 112.

To connect the first connecting electrode 111 and the second n-type electrode 201 stably and to connect the second connecting electrode 112 and the second p-type electrode 209 stably, a first bump 115a may be disposed between the first connecting electrode 111 and the second n-type electrode 201 and a second bump 115b may be disposed between the second connecting electrode 112 and the second p-type electrode 209.

In addition, since a step difference between the LED 120 and the third interlayer insulating layer 106b is compensated by heights of the bumps 115a and 115b, the sub LED 200 is disposed over the LED 120.

Thus, the second n-type electrode 201 of the sub LED 200 is electrically connected to the first connecting electrode 111 through the first bump 115a to be electrically connected to the first n-type electrode 121 of the LED 120.

In addition, the second p-type electrode 209 of the sub LED 200 is electrically connected to the second connecting electrode 112 through the second bump 115b to be electrically connected to the first p-type electrode 129 of the LED 120.

Specifically, in a light emitting diode (LED) display device 100 according to a first embodiment of the present disclosure, a reflecting layer 211 is further disposed between the second-second semiconductor layer 207 and the second p-type electrode 209 of the sub LED 200.

In the LED display device 100 according to a first embodiment of the present disclosure, when a voltage is applied to the red subpixel R-SP, the voltage is applied to the first n-type and first p-type electrodes 121 and 129 of the LED 120 through the first and second connecting electrodes 111 and 112. However, since the LED 120 in the red subpixel R-SP is deteriorated, the LED 120 in the red subpixel R-SP does not emit a light even when the voltage is applied.

Here, since the voltage applied to the first and second connecting electrodes 111 and 112 is transmitted to the second n-type electrode 201 of the sub LED 200 through the first connecting electrode 111 and is transmitted to the second p-type electrode 209 of the sub LED 200 through the second connecting electrode 112, the sub LED 200 emits a light.

Accordingly, in the LED display device 100 according to a first embodiment of the present disclosure, even when an additional process of removing the deteriorated LED 120 is not performed, reduction of a display quality due to the deteriorated pixel is prevented.

In addition, since it is not required to remove the deteriorated LED 120, a fabrication cost is reduced and a process efficiency is improved. Further, since an additional redundancy LED is not required, a fabrication cost is further reduced and a process efficiency is further improved.

Here, since a light emitted from the second active layer 205 of the sub LED 200 toward the LED 120 is upwardly reflected by the reflecting layer 211 between the second-second semiconductor layer 207 and the second p-type electrode 209, a light efficiency of the sub LED 200 is also improved.

The reflecting layer 211 may include a metallic material such as aluminum (Al) or silver (Ag), and it is not limited thereto.

In the LED display device 100 where the sub LED 200 is mounted, reduction of a display quality due to the deteriorated pixel is prevented by further forming an insulating layer on the sub LED 200 or disposing a light converting layer on the sub LED 200.

Figure 3:
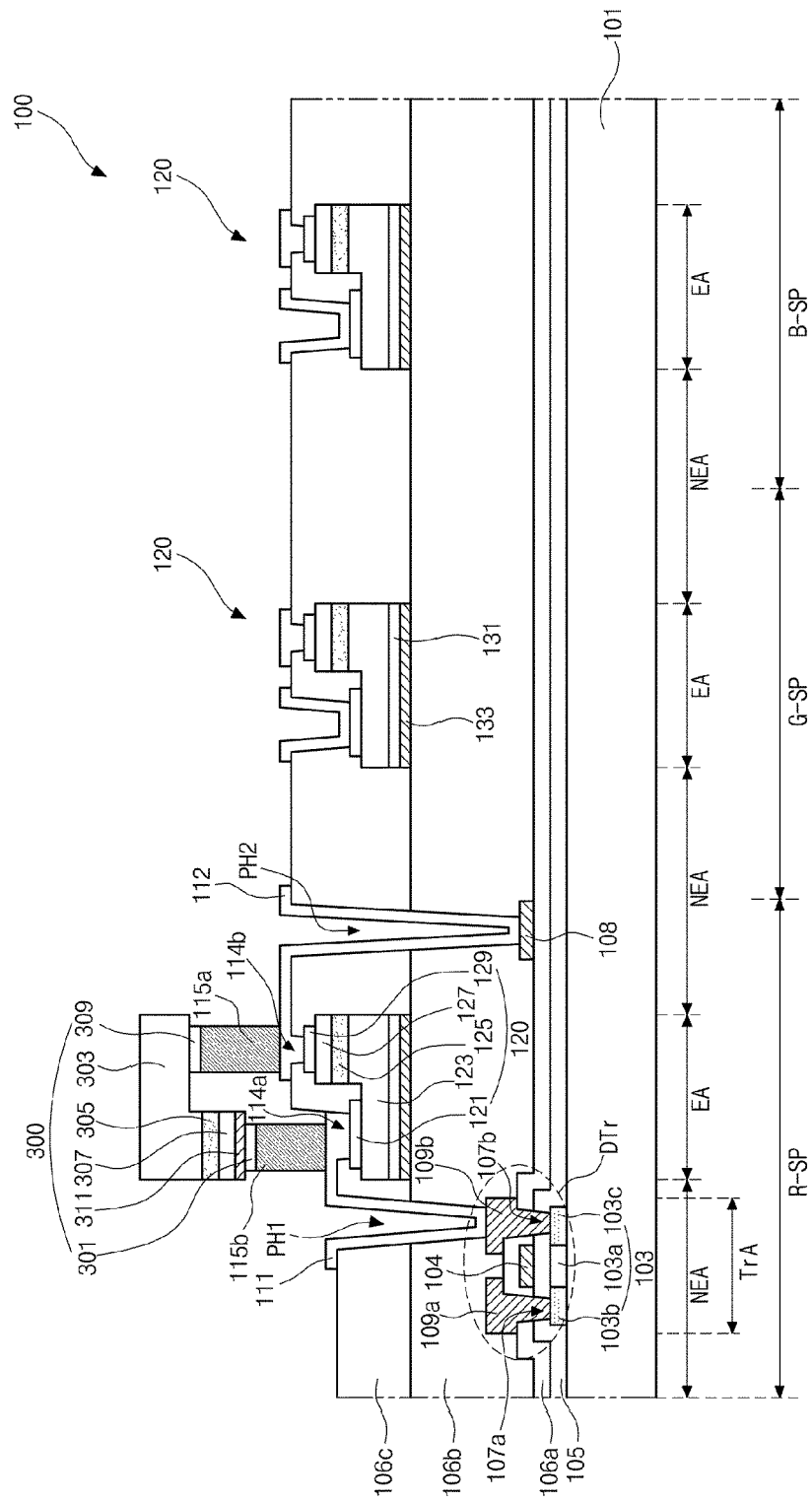
FIG. 3 is a schematic cross-sectional view showing three subpixels of a light emitting diode display device according to another first embodiment of the present disclosure.

Here, as shown in FIG. 3, a second-first semiconductor layer 303 of a sub LED 300 may include a semiconductor material of a p-type gallium nitride (p-GaN) such as gallium nitride (GaN), aluminum gallium nitride (AlGaN), indium gallium nitride (InGaN) or aluminum indium gallium nitride (AlInGaN), etc., a second-second semiconductor layer 307 may include a semiconductor material of an n-type gallium nitride (n-GaN) group such as gallium nitride (GaN), aluminum gallium nitride (AlGaN), indium gallium nitride (InGaN) or aluminum indium gallium nitride (AlInGaN), etc., a second p-type electrode 309 may be disposed on the second-first semiconductor layer 303, and a second n-type electrode 301 may be disposed on the second-second semiconductor layer 307.

Thus, the sub LED 300 is disposed over a deteriorated LED 120 so that the second p-type electrode 309 of the sub LED 300 can be electrically connected to a second connecting electrode 112 connected to a first p-type electrode 129 of the LED 120 and the second n-type electrode 301 can be electrically connected to a first connecting electrode 111 connected to a first n-type electrode 121 of the LED 120.

The reflecting layer 311 is disposed between the second n-type electrode 301 and the second-second semiconductor layer 307.

As mentioned above, in the LED display device 100 according to a first embodiment of the present disclosure, since the sub LED 200 and 300 electrically connected to the first and second connecting electrodes 111 and 112 for applying a voltage to the LED 120 is disposed over the deteriorated LED 120, deterioration of a display quality due to a deteriorated pixel is prevented without removing the deteriorated LED 120. Therefore, a fabrication cost is reduced and a process efficiency is improved.

In addition, since an additional redundancy LED is not required, a fabrication cost is reduced and a process efficiency is improved due to omission of an additional redundancy LED.

Further, since a location for an additional redundancy LED is not considered, a sufficient emitting area for the LED 120 is obtained and an emission efficiency of the LED 120 is also improved. Therefore, an image of a high luminance is obtained.

Moreover, since a number of subpixels R-SP, G-SP and B-SP per a unit area increases, the LED display device 100 having a high resolution is obtained.

Second Embodiment

Figure 4:
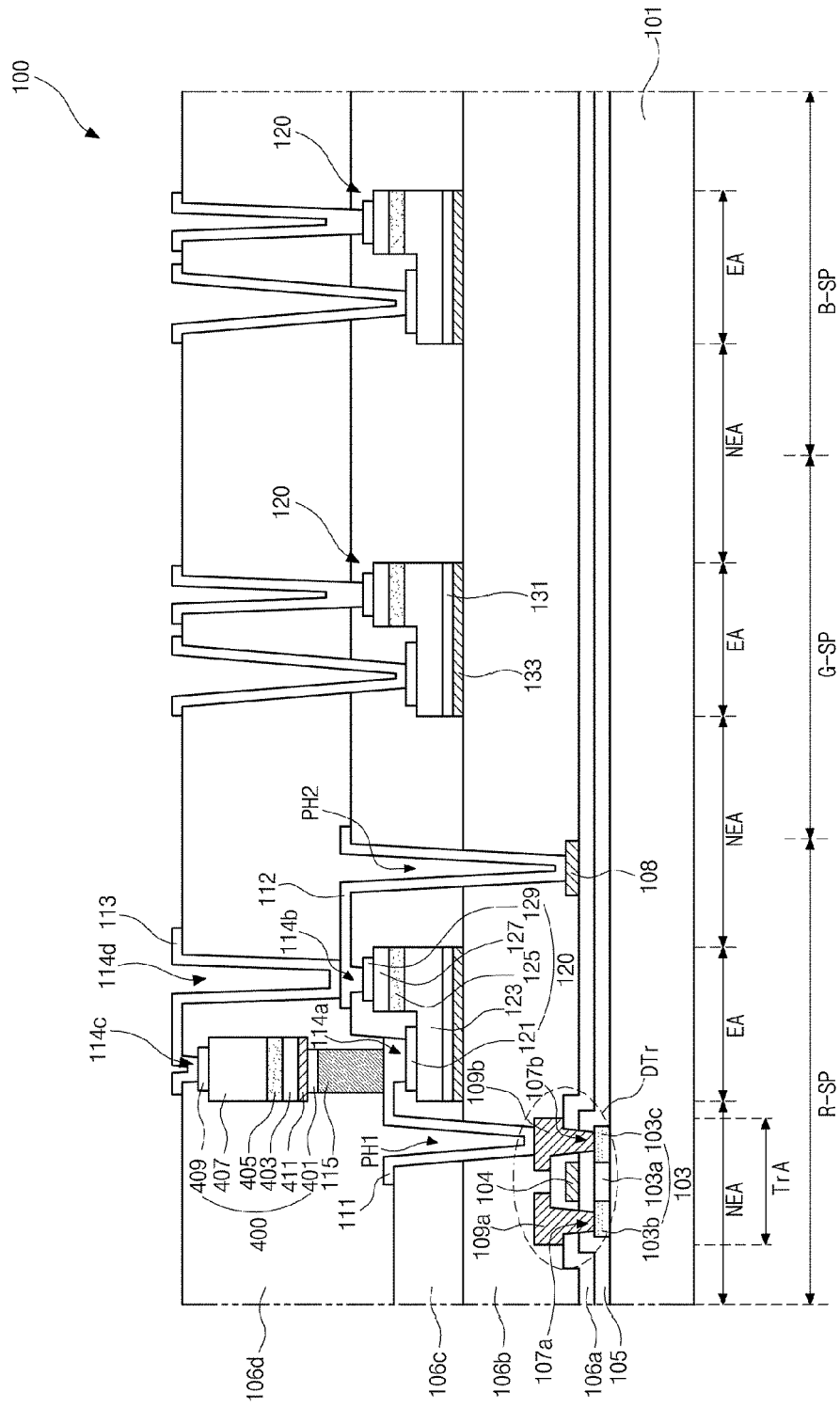
FIG. 4 is a schematic cross-sectional view showing three subpixels of a light emitting diode display device according to a second embodiment of the present disclosure.

FIG. 4 is a schematic cross-sectional view showing three subpixels of a light emitting diode display device according to a second embodiment of the present disclosure.

To avoid repetition of illustration, a part having the same function as a part of a first embodiment is designated by the same reference number, and a characteristic part of a second embodiment will be illustrated.

As shown, a driving thin film transistor DTr including source and drain electrodes 109a and 109b, a semiconductor layer 103 having source and drain regions 103b and 103c contacting the source and drain electrodes 109a and 109b, a gate insulating layer 105 on the semiconductor layer 103 and a gate electrode 104 is disposed in a switching area TrA at one side of a non-emitting area NEA. A common line 108 is disposed on a first interlayer insulating layer 106a on the gate insulating layer 105 at one side of the driving thin film transistor DTr.

A light emitting diode 120 is disposed on a second interlayer insulating layer 106b over the driving thin film transistor DTr, and a third interlayer insulating layer 106c is disposed on the LED 120. A first n-type electrode 121 of the LED 120 is electrically connected to the drain electrode 109b of the driving thin film transistor DTr through a first electrode contact hole 114a of the third interlayer insulating layer 106c and a drain contact hole PH1 of the second and third interlayer insulating layers 106b and 106c. The first n-type electrode 121 and the drain electrode 109b are electrically connected to each other through a first connecting electrode 111.

A first p-type electrode 129 of the LED 120 is electrically connected to the common line 108 through a second electrode contact hole 114b of the third interlayer insulating layer 106c and a common contact hole PH2 of the second and third interlayer insulating layers 106b and 106c. The first p-type electrode 129 and the common line 108 are electrically connected to each other through a second connecting electrode 112.

The LED 120 includes a first-first semiconductor layer 123 connected to the first n-type electrode 121, a first-second semiconductor layer 127 connected to the first p-type electrode 129 and a first active layer 125 disposed between the first-first and first-second semiconductor layers 123 and 127.

When the LED 120 corresponding to a red subpixel R-SP among the LEDs 120 of subpixels R-SP, G-SP and B-SP is deteriorated, a sub LED 400 is further disposed over the deteriorated LED 120.

In the sub LED 400, a second-first semiconductor layer 403, a second active layer 405, a second-second semiconductor layer 407 and a reflecting layer 411 are disposed between a second n-type electrode 401 and a second p-type electrode 409. The reflecting layer 411, the second-first semiconductor layer 403, the second active layer 405, the second-second semiconductor layer 407 and the second p-type electrode 409 are sequentially disposed on the second n-type electrode 401.

Here, the first-first semiconductor layer 123 of the LED 120 and the second-first semiconductor layer 403 of the sub LED 400 may include a semiconductor material of an n-type gallium nitride (n-GaN) group, and the first-second semiconductor layer 127 of the LED 120 and the second-second semiconductor layer 407 of the sub LED 400 may include a semiconductor material of a p-type gallium nitride (p-GaN). The second n-type electrode 401 of the sub LED 400 is electrically connected to the first connecting electrode 111 connecting the first n-type electrode 121 of the LED 120 and the drain electrode 109b of the driving thin film transistor DTr. A bump 115 may be disposed between the second n-type electrode 401 and the first connecting electrode 111.

A fourth interlayer insulating layer 106d is disposed on the sub LED 400, and the fourth interlayer insulating layer 106d has a third contact hole 114c exposing the second p-type electrode 409 and a fourth electrode contact hole 114d exposing the second connecting electrode 112.

Thus, the second p-type electrode 409 exposed through the third electrode contact hole 114c and the second connecting electrode 112 exposed through the fourth electrode contact hole 114d are electrically connected to each other through a third connecting electrode 113 on the fourth interlayer insulating layer 106d.

In the LED display device 100 according to a second embodiment of the present disclosure, when a voltage is applied to the red subpixel R-SP, the voltage is applied to the first n-type and first p-type electrodes 121 and 129 of the LED 120 through the first and second connecting electrodes 111 and 112. However, since the LED 120 in the red subpixel R-SP is deteriorated, the LED 120 in the red subpixel R-SP does not emit a light even when the voltage is applied.

Here, since the voltage applied to the first and second connecting electrodes 111 and 112 is transmitted to the second n-type electrode 401 of the sub LED 400 through the first connecting electrode 111 and is transmitted to the second p-type electrode 409 of the sub LED 400 through the second and third connecting electrodes 112 and 113, the sub LED 400 emits a light.

Accordingly, in the LED display device 100 according to a second embodiment of the present disclosure, even when an additional process of removing the deteriorated LED 120 is not performed, reduction of a display quality due to the deteriorated pixel is prevented.

In addition, since it is not required to remove the deteriorated LED 120, a fabrication cost is reduced and a process efficiency is improved. Further, since an additional redundancy LED is not required, a fabrication cost is further reduced and a process efficiency is further improved.

Here, since a light emitted from the second active layer 405 of the sub LED 400 is upwardly reflected by the reflecting layer 411 between the second-first semiconductor layer 403 and the second n-type electrode 401, a light efficiency of the sub LED 400 is also improved.

Although the fourth interlayer insulating layer 106d on the sub LED 400 is formed over a whole surface of the substrate 101 in the second embodiment of the present disclosure, the fourth interlayer insulating layer 106d may be formed to correspond to the red subpixel R-SP having the sub LED 400 by patterning.

In addition, when the fourth interlayer insulating layer 106d formed on a whole surface of the substrate 101 as shown, a lighting test of the LED 120 in each subpixel R-SP, G-SP and B-SP may be performed by applying a signal to each LED 120 through a probe.

Third Embodiment

Figure 5:
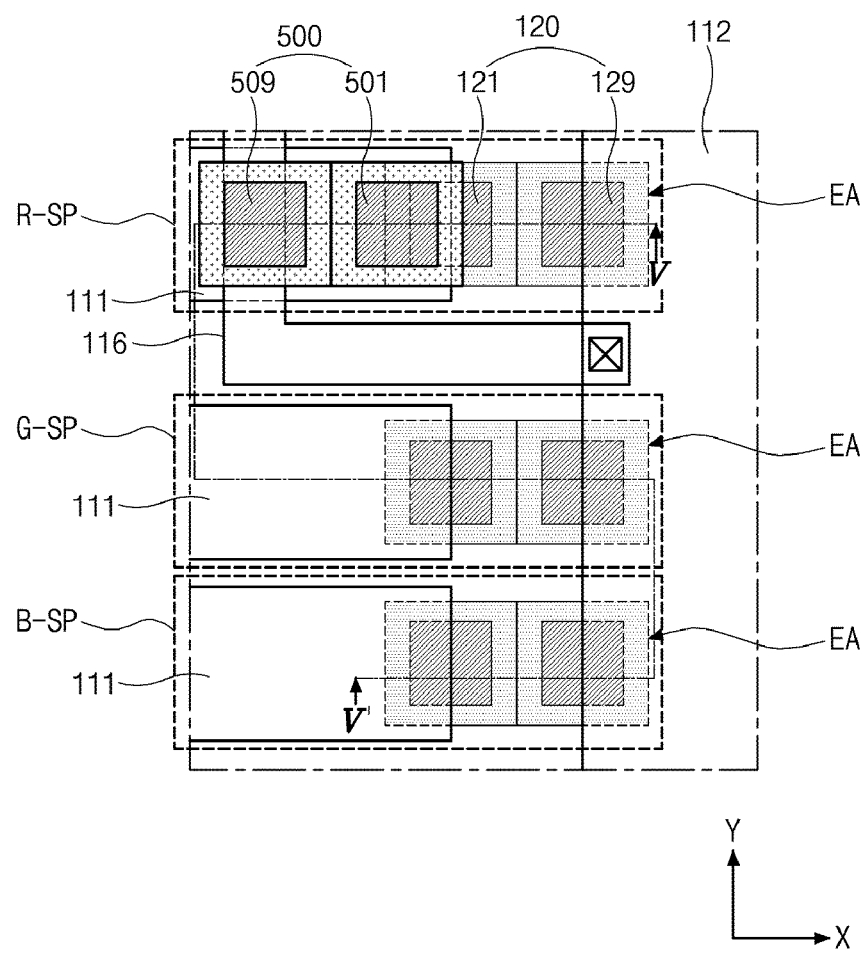
FIGS. 5 and 6 are schematic plan views showing three subpixels of a light emitting diode display device according to a third embodiment of the present disclosure.
Figure 6:
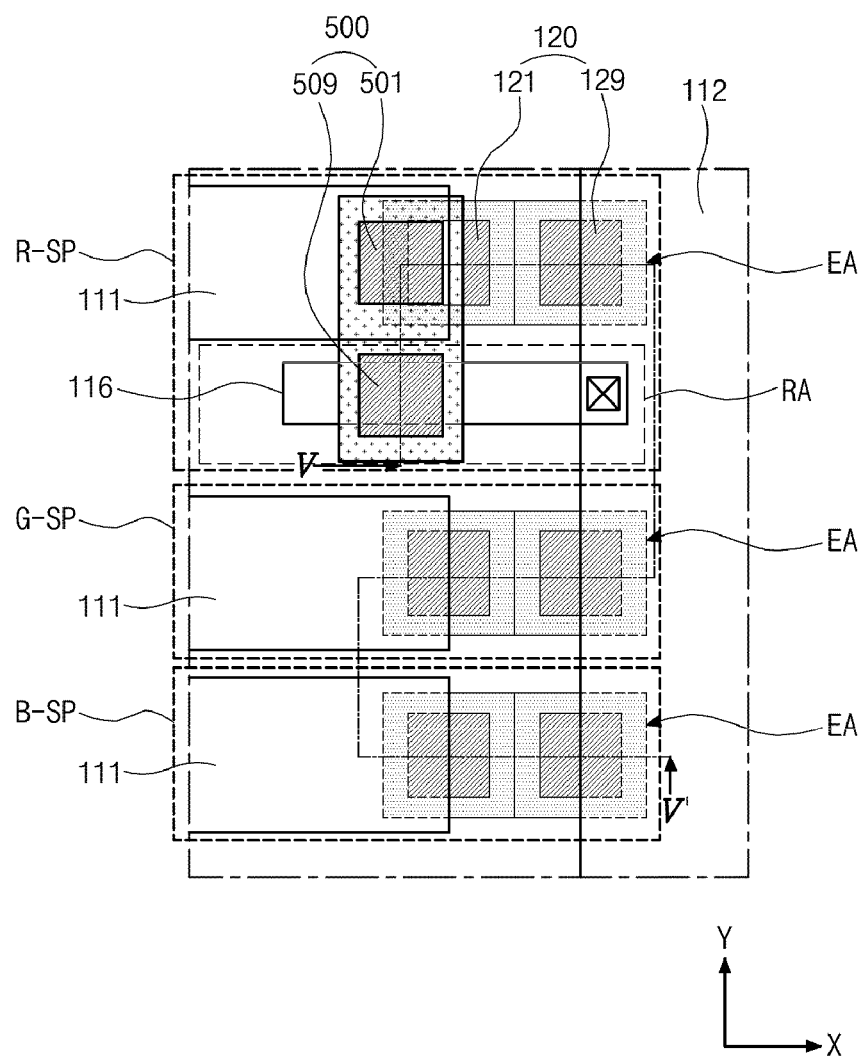
Figure 7:
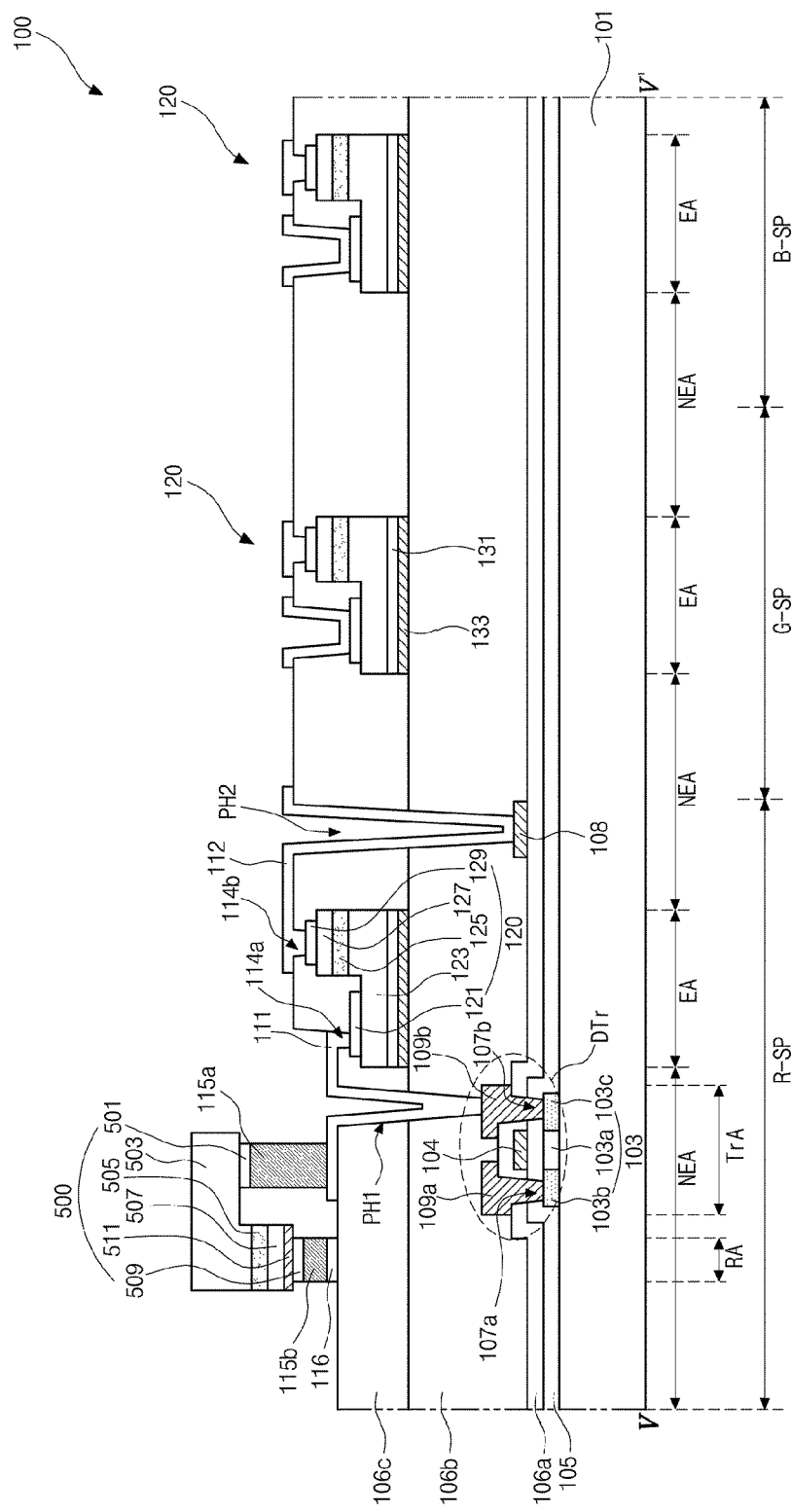
FIG. 7 is a schematic cross-section view taken along the line V-V' of FIGS. 5 and 6.

FIGS. 5 and 6 are schematic plan views showing three subpixels of a light emitting diode display device according to a third embodiment of the present disclosure, and FIG. 7 is a schematic cross-sectional view, taken along a line V-V' of FIGS. 5 and 6, showing three subpixels of a light emitting diode display device according to a third embodiment of the present disclosure.

To avoid repetition of illustration, a part having the same function as a part of first and second embodiments is designated by the same reference number, and a characteristic part of a third embodiment will be illustrated.

As shown in FIGS. 5 and 6, one unit pixel may be defined as three subpixels R-SP, G-SP and B-SP. A light emitting diode 120 is disposed in an emitting area EA in each subpixel R-SP, G-SP and B-SP. A first connecting electrode 111 for supplying a data signal to the LED 120 and a second connecting electrode 112 for supplying a common voltage to the LED 120 are disposed in each subpixel R-SP, G-SP and B-SP.

The first connecting electrode 111 may be connected to the first n-type electrode 121 of an anode of the LED 120, and the second connecting electrode 112 may be connected to the first p-type electrode 129 of a cathode of the LED 120.

Although it is shown that the second connecting electrodes 112 of the subpixels R-SP, G-SP and B-SP are connected to each other and the LEDs 112 share one second connecting electrode 112, the second connecting electrode 112 may be disposed to be divided in each subpixels R-SP, G-SP and B-SP.

When the LED 120 corresponding to a red subpixel R-SP among the LEDs 120 of subpixels R-SP, G-SP and B-SP is deteriorated, a subLED 500 is disposed over the deteriorated LED 120.

Here, the first n-type electrode 121 and the first p-type electrode 129 of the LED 120 disposed in each subpixel R-SP, G-SP and B-SP are disposed along a first direction X defined in a drawing. As shown in FIG. 5, the second n-type electrode 501 and the second p-type electrode 509 of the sub LED 500 over the deteriorated LED 120 among the LEDs 120 may be disposed along a first direction X defined in a drawing.

Alternatively, as shown in FIG. 6, the second n-type electrode 501 and the second p-type electrode 509 of the sub LED 500 may be disposed along a second direction Y different from the first direction X. For example, the second direction Y may be perpendicular to the first direction X.

The second n-type electrode 501 of the sub LED 500 may be electrically connected to the first connecting electrode 111, and the second p-type electrode 509 of the sub LED 500 may be electrically connected to an auxiliary electrode 116 extending from the second connecting electrode 112.

The auxiliary electrode 116 may be formed to extend from the second connecting electrode 112, or may be formed by a jumping type through a via hole. The auxiliary electrode 116 may be formed by various methods. The auxiliary electrode 116 may be formed to have the same material and the same layer as the first and second connecting electrodes 111 and 112, or may be formed to have the same material and the same layer as one of other electrodes.

When the sub LED 500 is disposed along the second direction Y defined in a drawing, a repair area RA may be defined between the red subpixel R-SP and the adjacent green subpixel G-SP. The red R-SP and the green subpixel G-SP may share the repair area RA.

When the LED 120 corresponding to the red subpixel R-SP is deteriorated, the sub LED 500 is disposed through the red subpixel R-SP and the repair RA along the second direction Y defined in a drawing. When the LED 120 corresponding to the green subpixel G-SP is deteriorated, the sub LED 500 corresponding to the green subpixel G-SP may be disposed through the green subpixel G-SP and the repair area RA along the second direction Y defined in a drawing.

The repair area RA may be designed in a portion adjacent to the deteriorated subpixel R-SP, G-SP and B-SP.

In a light emitting diode display device 100 according to a third embodiment of the present disclosure of FIG. 7, a driving thin film transistor DTr including source and drain electrodes 109a and 109b, a semiconductor layer 103 having source and drain regions 103b and 103c contacting the source and drain electrodes 109a and 109b, a gate insulating layer 105 on the semiconductor layer 103 and a gate electrode 104 is disposed in a switching area TrA at one side of a non-emitting area NEA of each subpixel R-SP, G-SP and B-SP on a substrate 101. A common line 108 is disposed on a first interlayer insulating layer 106a on the gate insulating layer 105 at one side of the driving thin film transistor DTr.

A light emitting diode 120 is disposed on a second interlayer insulating layer 106b over the driving thin film transistor DTr, and a third interlayer insulating layer 106c is disposed on the LED 120. A first n-type electrode 121 of the LED 120 is electrically connected to the drain electrode 109b of the driving thin film transistor DTr through a first electrode contact hole 114a of the third interlayer insulating layer 106c and a drain contact hole PH1 of the second and third interlayer insulating layers 106b and 106c. The first n-type electrode 121 and the drain electrode 109b are electrically connected to each other through a first connecting electrode 111.

A first p-type electrode 129 of the LED 120 is electrically connected to the common line 108 through a second electrode contact hole 114b of the third interlayer insulating layer 106c and a common contact hole PH2 of the second and third interlayer insulating layers 106b and 106c. The first p-type electrode 129 and the common line 108 are electrically connected to each other through a second connecting electrode 112.

An auxiliary electrode 116 electrically connected to the second connecting electrode 112 is further disposed in a repair area RA defined at one side of the first connecting electrode 111 on the third interlayer insulating layer 106c.

The LED 120 includes a first-first semiconductor layer 123 connected to the first n-type electrode 121, a first-second semiconductor layer 127 connected to the first p-type electrode 129 and a first active layer 125 disposed between the first-first and first-second semiconductor layers 123 and 127.

When the LED 120 corresponding to a red subpixel R-SP among the LEDs 120 of subpixels R-SP, G-SP and B-SP is deteriorated, a sub LED 500 is further disposed over the deteriorated LED 120.

In the sub LED 500, a second-first semiconductor layer 503, a second active layer 505, a second-second semiconductor layer 507 and a reflecting layer 211 are disposed between a second n-type electrode 501 and a second p-type electrode 509.

Here, the first-first semiconductor layer 123 of the LED 120 and the second-first semiconductor layer 503 of the sub LED 500 may include a semiconductor material of an n-type gallium nitride (n-GaN) group, and the first-second semiconductor layer 127 of the LED 120 and the second-second semiconductor layer 507 of the sub LED 500 may include a semiconductor material of a p-type gallium nitride (p-GaN). The second n-type electrode 201 of the sub LED 500 is electrically connected to the first connecting electrode 111 connecting the first n-type electrode 121 of the LED 120 and the drain electrode 109b of the driving thin film transistor DTr. A first bump 115a may be disposed between the second n-type electrode 501 and the first connecting electrode 111.

The second p-type electrode 509 of the sub LED 500 is electrically connected to the auxiliary electrode 116 electrically connected to the second connecting electrode 112 connecting the first p-type electrode 129 of the LED 120 and the common line 108. A second bump 115b may be disposed between the second p-type electrode 509 and the auxiliary electrode 116.

In the LED display device 100 according to a third embodiment of the present disclosure, when a voltage is applied to the red subpixel R-SP, the voltage is applied to the first n-type and first p-type electrodes 121 and 129 of the LED 120 through the first and second connecting electrodes 111 and 112. However, since the LED 120 in the red subpixel R-SP is deteriorated, the LED 120 in the red subpixel R-SP does not emit a light even when the voltage is applied.

Here, since the voltage applied to the first and second connecting electrodes 111 and 112 is transmitted to the second n-type electrode 501 of the sub LED 500 through the first connecting electrode 111 and is transmitted to the second p-type electrode 509 of the sub LED 500 through the second connecting electrode 112 and the auxiliary electrode 116, the sub LED 500 emits a light.

Accordingly, in the LED display device 100 according to a third embodiment of the present disclosure, even when an additional process of removing the deteriorated LED 120 is not performed, reduction of a display quality due to the deteriorated pixel is prevented.

In addition, since it is not required to remove the deteriorated LED 120, a fabrication cost is reduced and a process efficiency is improved. Further, since an additional redundancy LED is not required, a fabrication cost is further reduced and a process efficiency is further improved.

Here, since a light emitted from the second active layer 505 of the sub LED 500 toward the sub LED 500 is upwardly reflected by the reflecting layer 511 between the second p-type electrode 509 and the second-second semiconductor layer 507, a light efficiency of the sub LED 500 is also improved.

Further, in the LED display device 100 according to a third embodiment of the present disclosure, since the sub LED 500 is formed through the LED 120 transferred in each subpixel R-SP, G-SP and B-SP on the substrate 101 having the driving thin film transistor DTr, an additional sub LED 500 is not required and a process efficiency is further improved.

While the present disclosure has been described with reference to embodiments and examples, these embodiments and examples are not intended to limit the scope of the present disclosure. Rather, it will be apparent to those skilled in the art that various modifications and variations can be made in the present disclosure without departing from the spirit or scope of the disclosure. Thus, it is intended that the present disclosure cover the modifications and variations of the present disclosure provided they come within the scope of the appended claims and their equivalents. The various embodiments described above can be combined to provide further embodiments. All of patents, patent application publications, patent applications, foreign patents, foreign patent applications and non patent publications referred to in this specification and/or listed in the Application Data Sheet are incorporated herein by reference, in their entirety. Aspects of the embodiments can be modified, if necessary to employ concepts of the various patents, applications and publications to provide yet further embodiments. These and other changes can be made to the embodiments in light of the above detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An LED display device, comprising:
    first and second thin film transistors on a substrate;
    a first LED electrically coupled to the first thin film transistor;
    a second LED electrically coupled to the second thin film transistor; and
    a sub LED on the first LED, the sub LED electrically coupled to the first thin film transistor and including a reflecting layer reflecting a light toward a direction opposite to the first LED, wherein the second LED and the sub LED are configured to emit light when a signal is applied to the first and second thin film transistors.

2. The LED display device according to claim 1, wherein the first LED includes a first n-type electrode electrically coupled to a drain electrode of the thin film transistor through a first connecting electrode, and a first p-type electrode electrically coupled to a common line through a second connecting electrode, and wherein the sub LED includes a second n-type electrode electrically coupled to the first connecting electrode, and a second p-type electrode electrically coupled to the second connecting electrode.

3. The LED display device according to claim 2, further comprising first-first and first-second semiconductor layers and a first active layer between the first n-type electrode and the first p-type electrode, and second-first and second-second semiconductor layers and a second active layer between the second n-type electrode and the second p-type electrode.

4. The LED display device according to claim 3, wherein the reflecting layer is disposed between the second-second semiconductor layer and the second p-type electrode.

5. The LED display device according to claim 3, wherein the reflecting layer is disposed between the second-first semiconductor layer and the second n-type electrode.

6. The LED display device according to claim 2, wherein the second p-type electrode is electrically coupled to the second connecting electrode through a third connecting electrode.

7. The LED display device according to claim 2, wherein the second p-type electrode is electrically coupled to an auxiliary electrode extending from the second connecting electrode.

8. The LED display device according to claim 7, wherein the first n-type electrode and the first p-type electrode of the first LED are disposed along a first direction, and wherein the second n-type electrode and the second p-type electrode of the sub LED are disposed along the first direction.

9. The LED display device according to claim 7, wherein the first n-type electrode and the first p-type electrode of the first LED are disposed along a first direction, and wherein the second n-type electrode and the second p-type electrode of the sub LED are disposed along a second direction different from the first direction.

10. The LED display device according to claim 2, further comprising a first bump between the first connecting electrode and the second n-type electrode, and a second bump between the second connecting electrode and the second p-type electrode.

* * * * *